United States Patent [19]
Oyama

[11] Patent Number: 5,530,669
[45] Date of Patent: Jun. 25, 1996

[54] NON-VOLATILE SEMICONDUCTOR MEMORY DEVICE AND METHOD FOR RECOVERING WRITE CHARACTERISTICS

[75] Inventor: Ken-ichi Oyama, Tokyo, Japan

[73] Assignee: NEC Corporation, Japan

[21] Appl. No.: 330,688

[22] Filed: Oct. 28, 1994

[30] Foreign Application Priority Data

Oct. 28, 1993 [JP] Japan .................................. 5-291556

[51] Int. Cl.[6] .................................................. G11C 11/34
[52] U.S. Cl. ............... 365/185.01; 365/218; 365/185.29; 365/185.18
[58] Field of Search ........................ 365/182, 185, 365/900, 218, 185.01, 185.29, 185.18

[56] References Cited

U.S. PATENT DOCUMENTS 4,884,239  11/1989  Ono et al. ............................. 365/185
5,272,669  12/1993  Samachisa et al. .................... 365/185
5,357,463  10/1994  Kinney ................................. 365/218
5,357,476  10/1994  Kuo et al. ............................. 365/185

FOREIGN PATENT DOCUMENTS 2-284473  11/1990  Japan .

*Primary Examiner*—David C. Nelms
*Assistant Examiner*—Vũ A. Lê

[57] ABSTRACT

In an EEPROM, a substrate is grounded, and a voltage supply voltage (5 V) and a high voltage (12 V) are applied to a drain region and a control gate, respectively, while maintaining a source region in a floating condition, so that a voltage stress is applied to a tunnel gate oxide film. As a result, electrons trapped in the tunnel gate oxide film are extracted to a floating gate. Thus, deterioration of the tunnel gate oxide film which is caused by repetition of write/erase, will be recovered.

1 Claim, 6 Drawing Sheets

NON-VOLATILE SEMICONDUCTOR MEMORY DEVICE AND METHOD FOR RECOVERING WRITE CHARACTERISTICS

BACKGROUND OF THE INVENTION

1. Field of the Invention

The present invention relates to a non-volatile semiconductor memory device and a method for recovering a data write characteristics of the non-volatile semiconductor memory device. More specifically, the present invention relates to a non-volatile semiconductor memory device configured to store information in a floating gate, such as an EEPROM having a function of simultaneously erasing the memory cells as a whole, which is called a "flash memory", and a method for recovering a data write characteristics of the same non-volatile semiconductor memory device.

2. Description of Related Art

Referring to FIG. 1A, there is shown a layout patterm diagram of this type non-volatile semiconductor memory device, and referring to FIGS. 1B and 1C, there are shown sectional views taken along the line A—A in FIG. 1A.

As shown in FIG. 1A, in a memory array, a plurality of bit lines BL are, located to extend in parallel to each other, and a plurality of word lines WL are located to extend in parallel to each other and orthogonally to the bit lines BL. Under the word lines WL, a floating gate 3 is located, so that a memory cell MC is constituted at a position of the floating gate 3. In the memory cell MC, the word line WL constitutes a control gate 5. A source region 6 and a drain region 7 are formed in a P-type silicon substrate 1 so as to locate the control gate 5 between the source region 6 and the drain region 7. The source region 6 is formed to continue along the word line WL so that the source region 6 is in common to a plurality of memory cells. The drain region 7 is connected to the bit line BL through a contact hole 8.

As shown in FIG. 1B, the floating gate 3 is formed on a thin tunnel gate oxide film 3 formed on the P-type silicon substrate 1. On the floating gate 3, a gate insulator film 4 is formed, and the above mentioned control gate 5 is formed on the gate insulator film 4. As mentioned above, the control gate 5 is formed of a portion of the word line WL. In other words, the control gate 5 is formed integrally with the word line WL. At each side of the stacked structure of the floating gate 3 and the control gate 5, the source region 6 and the drain region 7 are formed in a surface of the silicon substrate 1 in a self-alignment manner.

This non-volatile semiconductor memory operation as a flash memory as mentioned below, with reference to FIGS. 1B and 1C illustrating a write operation and an erase operation, respectively.

For the writing, the source region 6 is connected to ground (0 V), and a high voltage of 12 V and a voltage supply voltage of 5 V are applied to the control gate 5 and the drain region 7 for about 10 µs (microsecond), respectively. As a result, as shown in FIG. 1B, hot electrons are generated in a channel region between the source region 6 and the drain region 7 and under the control gate 5. Some of the generated hot electrons are injected into the floating gate 3 through the tunnel gate oxide film 2. Thus, the writing is executed. In a written memory cell, a threshold as a MOS transistor increases.

On the other hand, for reading, the source region 6 is connected to ground (0 V), and 5 V and 1 V are applied to the control gate 5 and the drain region 7, in order to detect whether or not a current flows through the memory cell. Under this bias condition, no current flows through the written memory cell, but a current flows through an erased memory cell.

For erase, 0 V and a high voltage of 10 V are applied to the control gate 5 and the source region 6, respectively, so that, due to a F-N (Fowler-Nordheim) tunnel phenomenon between the floating gate and the source region, electrons accumulated in the floating gate 3 are extracted through the tunnel gate oxide film 2 to the source region 2, as shown in FIG. 1C.

One of important problems currently encountered in this type of non-volatile semiconductor memory device, is deterioration of a write characteristics and an erase characteristics caused by repetition of the write and erase.

More specifically, the deterioration of the write characteristics and the erase characteristics caused by repetition of data write/erase is that, as shown in FIG. 2, the elevation of the threshold by the writing becomes small and the drop of the threshold by the erase becomes small. In particular, the writing characteristics deteriorates with a relative small number of write/erase repetitions so that it becomes impossible to elevate the "threshold after write" to a lower limit of a write level (a lower limit of a level permitting to recognize that the memory cell is in a written condition). The deterioration of the write characteristics restricts the data rewrite number (the number of write/erase operations) in the non-volatile semiconductor memory device.

The following is a reason about why the writing characteristics deteriorates.

In the writing operation, hot electrons generated by causing the drain current to flow, are injected into the floating gate 3 through the tunnel gate oxide film 2 in the proximity of the drain region 7, under influence of the high voltage applied to the control gate 5. In this process, a portion of the injected electrons is trapped in the gate oxide film 2 when the injected electrons pass through the gate oxide film 2. Therefore, if the write/erase operation is repeated, the electrons trapped in the tunnel gate oxide film 2 in the proximity of the drain region 7, increases. As a result, the trapped electrons relaxes a vertical electric field created in the tunnel gate oxide film 2 by the positive voltage applied to the gate electrode 5 at the time of writing data. Because of this, a writing speed of the memory cell after the write/erase operation is repeated becomes lower than that of a new memory cell just after it has been manufactured. In addition, the "threshold after writing" cannot sufficiently elevate.

On the other hand, the deterioration of the erase characteristics is attributable to the fact that, when the electrons accumulated in the floating gate 3 are extracted to the source region 2, a high electric field occurs in a portion of the tunnel gate oxide film 2 in the proximity of the source region 6, and the tunnel gate oxide film 2 is deteriorated by this high electric field portion.

In order to overcome this problem, Japanese Patent Application Laid-open Publication JP-A-02-0284473 has proposed to relax concentration of an electric field in an end of the source region, by (1) rounding the shape of the end of the floating gate 3 opposing to the source region 6, and (2) forming a low impurity density region in the end of the source region 6 opposing to the floating gate 3.

However, since the approach disclosed in JP-A-02-0284473 does not improve the writing characteristics, it could not remarkably increase the re-write number of the memory.

SUMMARY OF THE INVENTION

Accordingly, it is an object of the present invention to provide a non-volatile semiconductor memory device which has overcome the above mentioned defect of the conventional ones.

Another object of the present invention is to provide a non-volatile semiconductor memory device having a means for extracting the electrons trapped in the tunnel gate oxide film due to the writing, so that the re-write number of the memory can be remarkably increased.

Still another object of the present invention is to provide a method for extracting the electrons trapped in the tunnel gate oxide film due to the writing, so that the re-write number of the non-volatile semiconductor memory device can be remarkably increased.

The above and other objects of the present invention are achieved in accordance with the present invention by a non-volatile semiconductor memory device including at least one electrically erasable memory cell having a source region, a drain region, a channel region defined between the source region and the drain region, and a stacked gate structure formed on the channel region and including a first gate insulator film, a floating gate electrode, a second gate insulator film and a control gate electrode stacked on the channel region in the named order, the non-volatile semiconductor memory device having a write mode, a read mode, an erase mode and a stress application mode, the non-volatile semiconductor memory device including means for applying, in the stress application mode, a voltage stress on the first gate insulator film while maintaining a condition in which no channel current flows.

According to another aspect of the present invention, there is provided a method for recovering a data write characteristics of a non-volatile semiconductor memory device which includes at least one electrically erasable memory cell having a source region, a drain region, a channel region defined between the source region and the drain region, and a stacked gate structure formed on the channel region and including a first gate insulator film, a floating gate electrode, a second gate insulator film and a control gate electrode stacked on the channel region in the named order, the method including the step of applying a voltage stress on the first gate insulator film while maintaining a condition in which no channel current flows, thereby extracting electrons trapped in the first gate insulator film.

The above and other objects, features and advantages of the present invention will be apparent from the following description of preferred embodiments of the invention with reference to the accompanying drawings.

DESCRIPTION OF THE PREFERRED EMBODIMENTS

Figure 3:
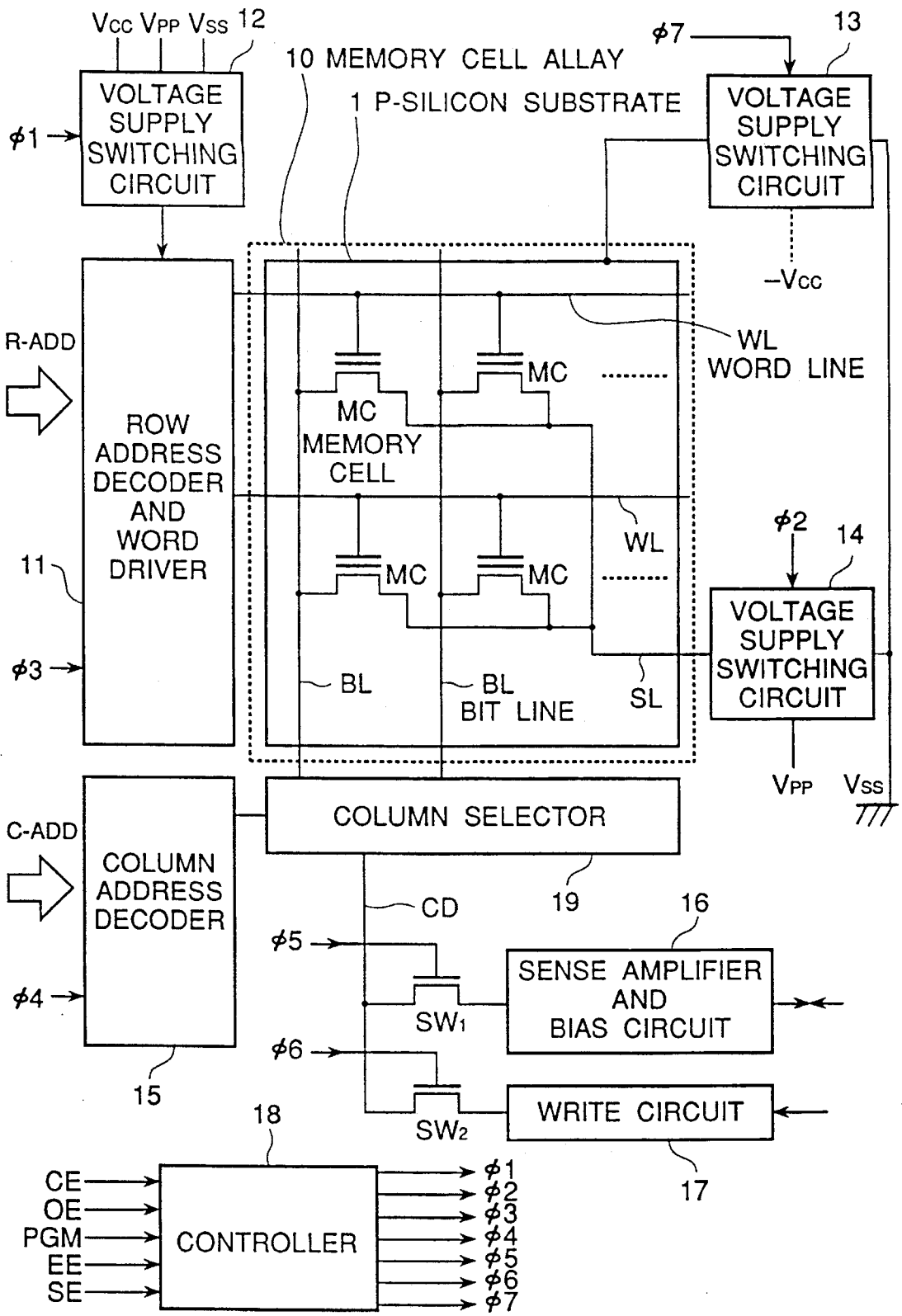
FIG. 3 is a block diagram of one embodiment of the non-volatile semiconductor memory device in accordance with the present invention.

Referring to FIG. 3, there is shown a block diagram of one embodiment of the non-volatile semiconductor memory device in accordance with the present invention. The shown embodiment is applied to a flash memory.

Figure 1A:
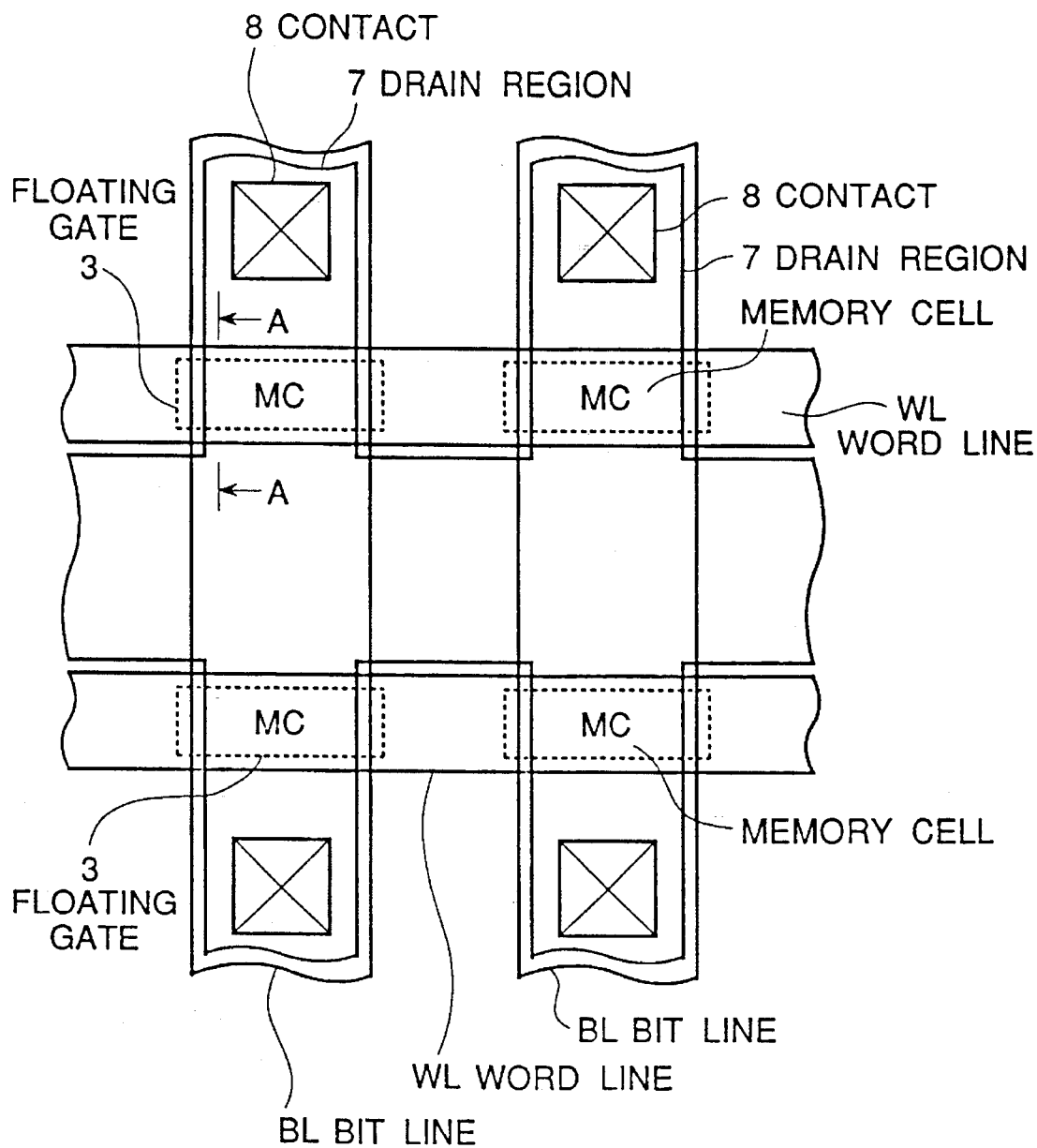
FIG. 1A is a layout pattern diagram of an EEPROM type non-volatile semiconductor memory device.
Figure 1B:
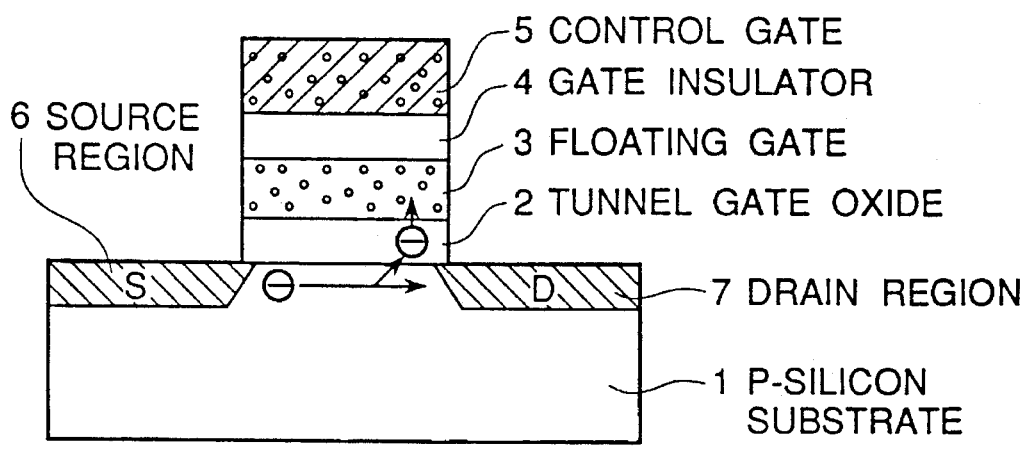
FIGS. 1B and 1C are diagrammatic sectional views taken along the line A—A in FIG. 1A, but illustrating a write operation and an erase operation, respectively.
Figure 1C:
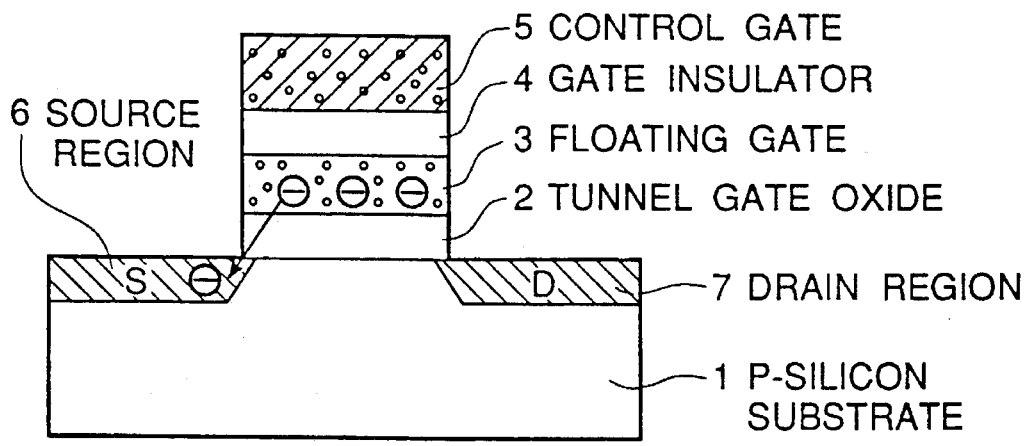
Figure 2:
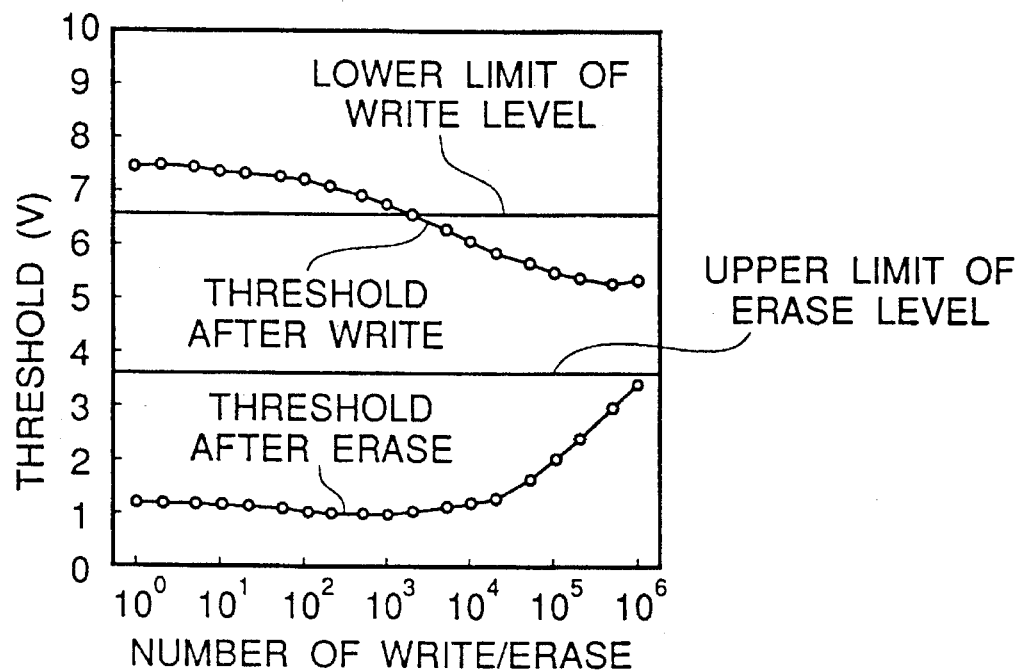
FIG. 2 is a graph illustrating the write characteristics and the erase characteristics of the conventional non-volatile semiconductor memory device.

In the shown embodiment, a memory cell array 10 and memory cells MC included in the memory cell array 10 are the same in construction as the memory cell array and the memory cells shown in FIGS. 1A, 1B and 1C, respectively. A plurality of word lines WL in the memory cell array 10 are connected to outputs of a row address decoder and word driver 11, which receives and decodes a row address R-ADD so as to drive a word line selected as the decoding of the received row address. This row address decoder and word driver 11 is also controlled by a control signal $\phi 3$. A plurality of bit lines BL in the memory cell array 10 are connected through a column selector 19 to a common data line CD. A source region of each memory cell MC is connected in common to a source line SL.

The shown semiconductor memory device includes three voltage supply switching circuits 12, 13 and 14, which receive a voltage supply voltage Vcc, a high voltage Vpp and a ground voltage Vss. The voltage supply voltage Vcc is on the order of 5 V, and the high voltage Vpp is on the order of 12 V, which is generated by an internal step-up circuit (not shown) from the voltage supply voltage.

Specifically, the voltage supply switching circuit 12 receives all of the voltage supply voltage Vcc, the high voltage Vpp and the ground voltage Vss, and is controlled by a switch control signal $\phi 1$ to supply a selected voltage to the row address decoder and word driver 11. The voltage supply switching circuit 13 is controlled by a switch control signal $\phi 7$ to supply the ground voltage Vss to the P-type silicon substrate 1. The voltage supply switching circuit 14 receives the high voltage Vpp and the ground voltage Vss, and is controlled by a switch control signal $\phi 2$ so as to supply the ground voltage Vss to the source line SL in a writing mode and in a reading mode, and also to supply the high voltage Vpp to the source line SL in an erasing mode.

The column selector 19 is controlled by a column address decoder 15, which receives and decodes a column address C-ADD so as to output an output selection signal to the column selector 19. Therefore, the column selector 19 drives a bit line selected by the output selection signal from the column address decoder 15. The column address decoder 15 is also controlled by a control signal $\phi 4$.

The common data line CD is connected to a sense amplifier and bias circuit 16 through a switch SW1 controlled by a switch control signal φ5. In the reading mode, this sense amplifier and bias circuit 16 supplies a bias voltage on the order of 1 V to the drain region of the memory cell, and also amplifies a potential of the common data line CD which is determined on the basis of whether the selected memory cell is conductive or non-conductive.

The common data line CD is also connected to a write circuit 17 through a switch SW2 controlled by a switch control signal φ6. In the write mode, the write circuit 17 drives the common data line CD with the voltage supply voltage Vcc.

An internal control of the flash memory is executed by a controller 18, which receives from an external a chip enable signal CE indicative of a chip selection, an output enable signal OE indicative of a read-out operation, a program signal PGM indicative of a writing operation, an erase enable signal EE indicative of an erasing operation, and a stress enable signal SE indicative of a stress application mode. On the basis of these external signals, the controller 18 selectively activates the control signals φ1 to φ7 so as to determine an internal mode of the flash memory.

When the reading operation is instructed, namely, when the reading mode is designated, the voltage supply switching circuit 12 is controlled by the switch control signal φ1 to supply the voltage supply voltage Vcc to the row address decoder and word driver 11. Simultaneously, the voltage supply switching circuit 14 is controlled by the switch control signal φ2 to supply the ground voltage Vss to the source line SL. Furthermore, the switch SW1 is turned on by the switch control signal φ5.

Thus, a voltage condition for the memory cell reading operation is prepared. If a memory cell is selected on the basis of the row address R-ADD and the column address C-ADD, data corresponding to the conductive/non-conductive condition of the selected memory cell is read out through the sense amplifier and bias circuit 16.

When the writing operation is instructed, namely, when the writing mode is designated, the voltage supply switching circuit 12 is controlled by the switch control signal φ1 to supply the high voltage Vpp to the row address decoder and word driver 11. Simultaneously, the voltage supply switching circuit 14 is controlled by the switch control signal φ2 to supply the ground voltage Vss to the source line SL. Furthermore, the switch SW2 is turned on by the switch control signal φ6.

Thus, a voltage condition for the memory cell writing operation is prepared. If a memory cell is selected on the basis of the row address R-ADD and the column address C-ADD, the voltage supply voltage Vcc is applied from the write circuit 17 to the drain region of the selected memory cell, so that the data is written into the selected memory cell.

When the erase operation is instructed, namely, when the erase mode is designated, the voltage supply switching circuit 12 is controlled by the switch control signal φ1 to supply the ground voltage Vss to the row address decoder and word driver 11. Simultaneously, the voltage supply switching circuit 14 is controlled by the switch control signal φ2 to supply the high voltage Vpp to the source line SL. Furthermore, the row address decoder and word driver 11 is controlled by the switch control signal φ3 so as to supply the ground voltage Vss to all of the word lines.

Thus, all the memory cells included in the memory cell array 10 are given with a voltage condition for the memory cell erasing operation. As a result, all the memory cells are erased.

When a predetermined number of write/erase operations have been carried out for the shown semiconductor memory device, or when a deterioration of the write characteristics is observed, a stress application mode is selected.

When the stress application mode is designated, the voltage supply switching circuit 12 is controlled by the switch control signal φ1 to supply the high voltage Vpp to the row address decoder and word driver 11. Simultaneously, the voltage supply switching circuit 14 is controlled by the switch control signal φ2 to put the source line SL in an open condition or in a floating condition. Furthermore, the switch SW2 is turned on by the switch control signal φ6.

Furthermore, the row address decoder and word driver 11 is controlled by the switch control signal φ3 so as to supply the high voltage Vpp to all of the word lines, and the column address decoder 15 is controlled by the switch control signal φ4 so as to supply the voltage supply voltage Vcc supplied from the write circuit 17, to all of the bit lines BL through the column selector 19. A period of time of this stress application mode is preferred in the range of 1 millisecond to 20 milliseconds. Now, it is assumed in this embodiment that the stress application mode is maintained for 10 milliseconds.

Figure 4:
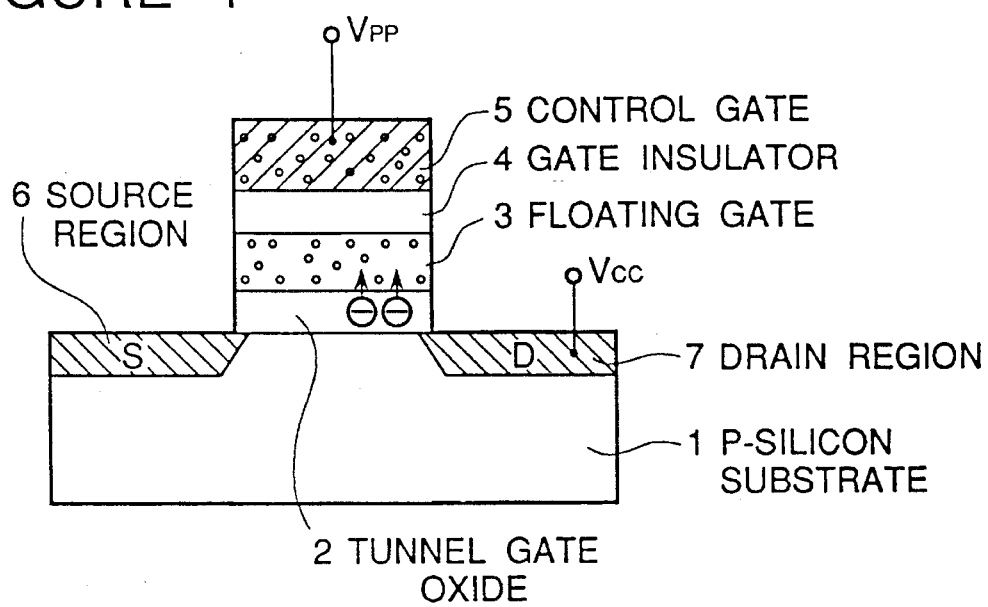
FIG. 4 is a diagrammatic sectional view of the memory cell illustrating the advantage of the embodiment of the non-volatile semiconductor memory device in accordance with the present invention.

Thus, when the stress application mode is executed, a high electric field is applied across the tunnel gate oxide film 2. As a result, as illustrated in FIG. 4, electrons trapped in the tunnel gate oxide film 2 is extracted or released into the floating gate 3. In this process, since he electric field applied to the tunnel gate oxide film 2 is emphasized in a portion of the tunnel gate oxide film 2 in the proximity of the drain region, the electrons much trapped in the portion of the tunnel gate oxide film 2 in the proximity of the drain region are effectively extracted or discharged out. Accordingly, if the stress application mode is executed, the deterioration of the tunnel gate oxide film 2 is recovered or restored.

Figure 5:
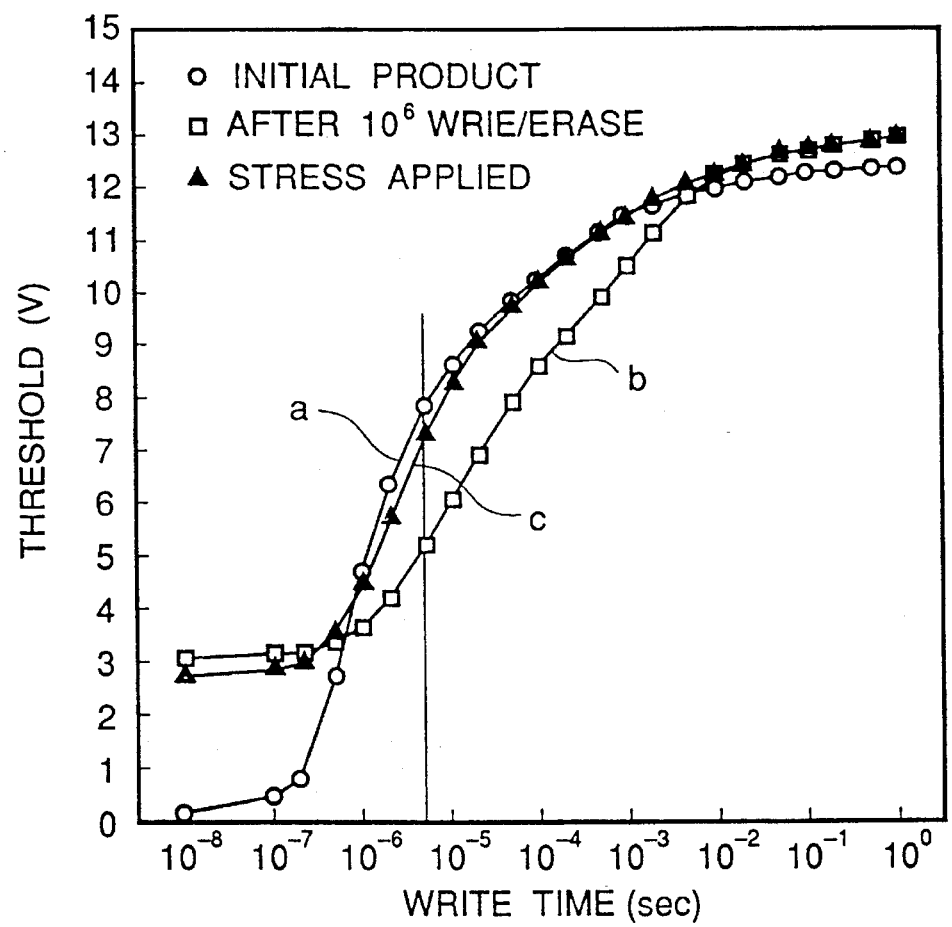
FIG. 5 is a graph illustrating the write characteristics of the first embodiment of the non-volatile semiconductor memory device in accordance with the present invention and the conventional example.

Referring to FIG. 5, there is shown a graph illustrating the writing characteristics. In the graph of FIG. 5, the axis of abscissas indicate the writing time, and the axis of ordinates shows the threshold. The curve "a" indicates the writing characteristics of an initial product, and the curve "b" represents the writing characteristics of a "sample after $10^6$ re-write operations". The curve "a" shows the writing characteristics after the stress is applied in accordance with this embodiment to the "sample after $10^6$ re-write operations".

It would be seen from the graph of FIG. 5 that the write characteristics can be restored near to that of the initial product, by executing the above mentioned stress application. For example, in the case of the writing time of $5 \times 10^6$ seconds, the threshold can be elevated to only about 5.2 V in the "sample after $10^6$ re-write operations", but can be elevated to about 7.2 V in the sample after the stress is applied in accordance with this embodiment.

Turning to FIG. 3, a second embodiment of the present invention will now be described.

In the second embodiment, there is provided an internal voltage supply circuit (not shown) for generating −Vcc, which is supplied to the voltage supply switching circuit 13. Write, read and erase operations of the second embodiment are the same as those of the first embodiment, and therefore, explanation thereof will be omitted.

In the second embodiment, when the stress application mode is designated, the voltage supply switching circuit 12 is controlled by the switch control signal φ1 to supply the high voltage Vpp to the row address decoder and word driver 11. Simultaneously, the voltage supply switching circuit 14 is controlled by the switch control signal φ2 to put the source line SL in an open condition or in a floating condition. Furthermore, the column selector 19 is controlled to put all the bit lines into an open condition or in a floating condition. The row address decoder and word driver 11 is controlled by the switch control signal φ3 so as to supply the high voltage Vpp to all of the word lines. The voltage supply switching circuit 13 is controlled by the switch control signal φ7 to supply a negative voltage supply voltage of −Vcc to the P-type silicon substrate 1.

Thus, a high electric field is applied across the tunnel gate oxide film 2, so that electrons trapped in the tunnel gate oxide film 2 is extracted or released into the floating gate 3. Accordingly, the deterioration of the tunnel gate oxide film 2 is recovered or restored. In the second embodiment, the stress application mode is maintained for 10 milliseconds for example.

Now, the method for recovering the write characteristics of the semiconductor memory will be described with reference to the flow charts of FIGS. 6A and 6B.

In the above mentioned embodiments, when a predetermined number of write/erase operations have been carried out for the shown semiconductor memory device, or when a deterioration of the write characteristics is observed, the stress application mode has been executed. However, in the following embodiments of the method, the stress application is executed at each time the erase operation is executed.

Figure 6A:
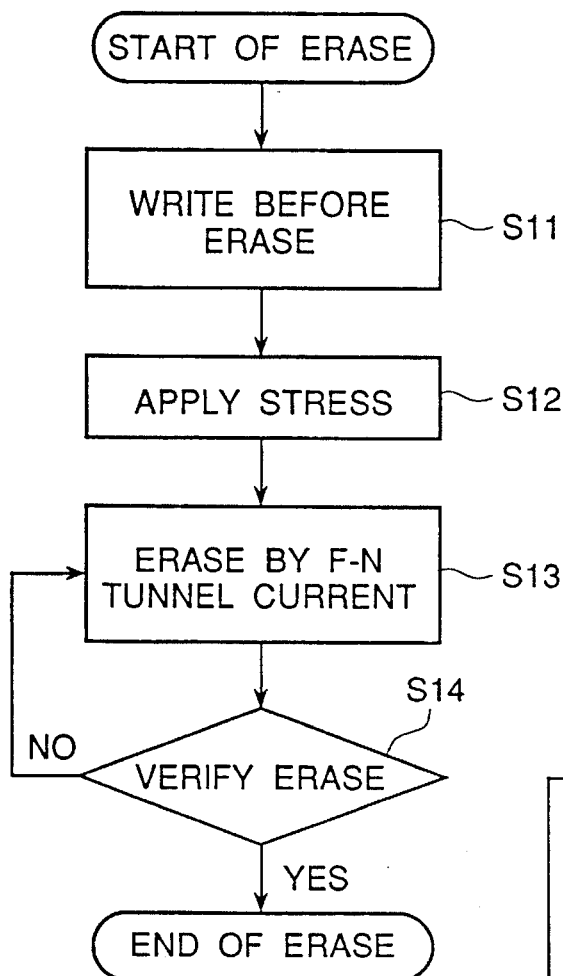
FIGS. 6A and 6B are flow charts illustrating two embodiments of the method in accordance with the present invention for recovering the write characteristics of the non-volatile semiconductor memory device.

In an embodiment of the method shown in FIG. 6A, prior to an actual erase operation, a "writing before erase" is carded out by injecting hot electrons (Step S11). The reason for this step is that, if the erase operation is performed in a condition that both of written memory cells and not-written memory cells exist, the "threshold after erase" will greatly vary so that many over-erased memory cells and many insufficiently erased memory cells appears. In order to avoid this inconvenience, the step S11 is carried out.

In a step S12, a stress is applied to each memory cell for 10 milliseconds, by applying 12 V, 5 V and 0 V to the control gate, the drain region and the substrate, respectively, for the purpose of recovering the deterioration of the tunnel gate oxide film. Then, the electrons trapped in the floating gate is extracted to the source region by the F-N tunneling (Step S13). In a step S14, the threshold of a predetermined memory cell is measured so as to verify whether or not the erase is sufficiently completed. If the erase is not sufficiently completed, the operation is returned to the step S13.

Figure 7:
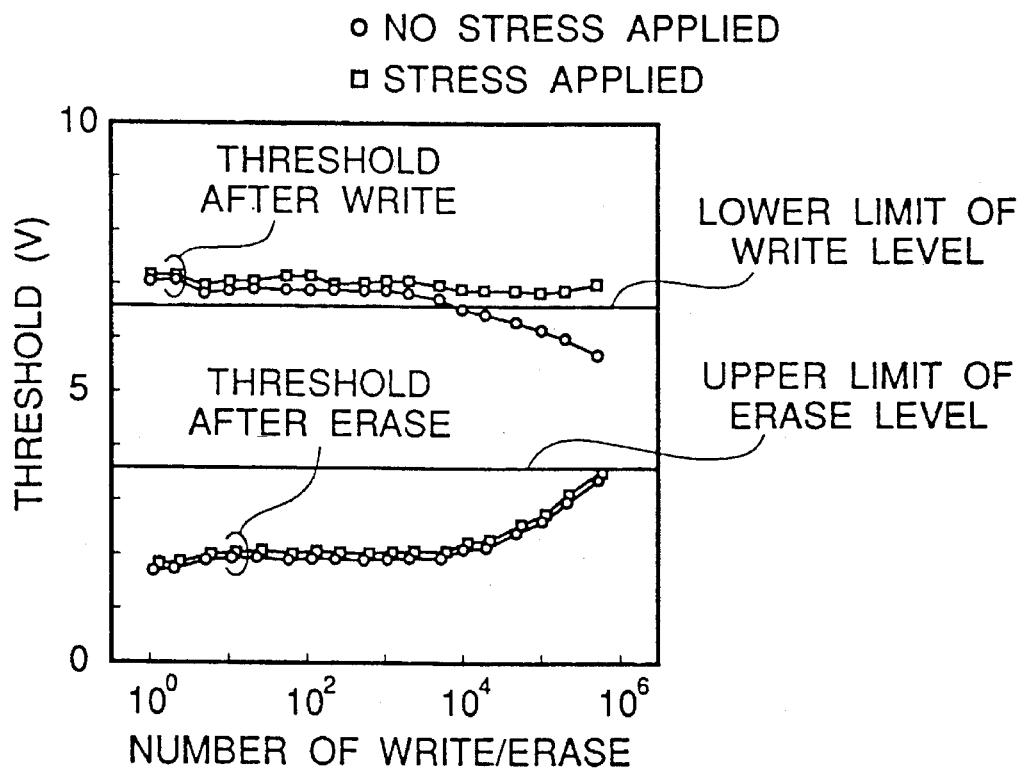
FIG. 7 is a graph illustrating the write characteristics of the first embodiment of the non-volatile semiconductor memory device in accordance with the present invention and the conventional example.

Referring to FIG. 7, there is shown a graph illustrating the change of the threshold in the case that the write/erase operation is repeated while executing the stress application processing at each time the erase operation is performed, and the change of the threshold in the case that the write/erase operation is repeated by using the conventional erase method. It will be seen from FIG. 7 that if the erase method of the present embodiment is adopted, even if the number of write/erase exceeds $10^6$, the "threshold after write" can be elevated to a level higher than the lower limit of the write level. The write/erase repetition life of the semiconductor memory can be elongated.

Figure 6B:
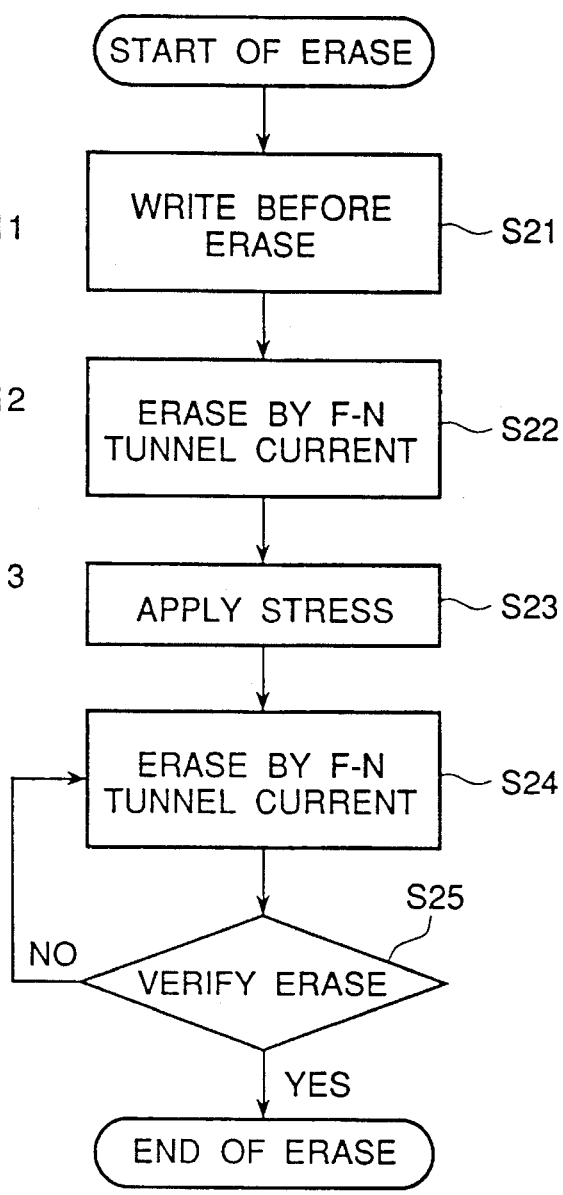

FIG. 6B illustrates another embodiment of the write characteristics recovering method.

Prior to an actual erase operation, a "writing before erase" is carried out by injecting hot electrons (Step S21). Then, in a step S22, the electrons trapped in the floating gate is extracted to the source region by the F-N tunneling. Furthermore, a stress is applied to each memory cell for 10 milliseconds, by applying 12 V, 5 V and 0 V to the control gate, the drain region and the substrate, respectively, for the purpose of recovering the deterioration of the tunnel gate oxide film (Step S23). Again, the electrons trapped in the floating gate is extracted to the source region by the F-N tunneling (Step S24). In a step S25, the threshold of a predetermined memory cell is measured so as to verify whether or not the erase is sufficiently completed. If the erase is not sufficiently completed, the operation is renamed to the step S25.

In the embodiment shown in FIG. 6A, after the writing is performed for all the memory cells, the stress application for recovering the deterioration is performed. In this method, the high voltage is applied to the control gate in the condition that the electrons are accumulated in the floating gate, the electric field created by the voltage applied to the control gate is cancelled or weakened to some degree by the electrons accumulated in the floating gate. Therefore, a substantial time is needed for extracting the trapped electrons. In the embodiment shown in FIG. 6B, since the stress is applied in the condition that no electron exists in the floating gate, the trapped electrons can be effectively extracted.

As will be seen from the above, according to the present invention, an electric field stress is applied to extract the electrons trapped in the tunnel gate oxide film when the data write characteristics deteriorates or when the erase operation is executed. Accordingly, it is possible to remove the electrons trapped in the tunnel gate oxide film by repeating the writing, and therefore, it is possible to recover the deterioration of the tunnel gate oxide film. Therefore, even if a large number of write/erase is performed, the write can be performed to have a sufficiently high threshold. Namely, the lift of the rewritable non-volatile semiconductor memory device can be remarkably elongated.

In addition, according to the present invention, since the voltage stress is applied to all the memory cells, the characteristics deterioration can be recovered for a short time. Furthermore, since the characteristics deterioration can be recovered without causing the channel current to flow through the memory cells, the current consumption caused by applying the voltage stress is very small. Therefore, the characteristics deterioration processing can be carried out by using an internal step-up circuit.

The invention has thus been shown and described with reference to the specific embodiments. However, it should be noted that the present invention is in no way limited to the details of the illustrated structures but changes and modifications may be made within the scope of the appended claims.

For example, the high voltage and the voltage supply voltage are not limited to 12 V and 5 V, respectively. In addition, the embodiments have been explained in the case of the flash memory. However, the present invention is not limited to the flash memory, and can be applied to a semiconductor memory device configured to be able to erasing the memory cells in units of byte.

I claim:

1. A non-volatile semiconductor memory device including at least one electrically erasable memory cell having a source region, a drain region, and a channel region defined between the source region and the drain region, and a stacked gate structure formed on the channel region and including a first gate insulator film, a floating gate electrode, a second gate insulator film and a control gate electrode stacked on the channel region in the named order, the non-volatile semiconductor memory device comprising:

a write mode, a read mode, an erase mode and a stress application mode, in said stress application mode, a high positive voltage is applied to said control gate electrode, an intermediate positive voltage is applied to said drain voltage, and a ground voltage or a negative voltage is applied to a substrate, so that a voltage stress is applied on said first gate insulator film, while maintaining a condition in which no channel current flows.

* * * * *